United States Patent [19]

Hasler

[11] Patent Number: 4,556,990
[45] Date of Patent: Dec. 3, 1985

[54] TUNER

[75] Inventor: Rudolf Hasler, Vienna, Austria

[73] Assignee: U.S. Philips Corporation, New York, N.Y.

[21] Appl. No.: 511,378

[22] Filed: Jul. 6, 1983

[30] Foreign Application Priority Data

Jul. 8, 1982 [AT] Austria .................................. 2663/82

[51] Int. Cl.$^4$ ............................................... H04B 1/26
[52] U.S. Cl. ..................................... 455/333; 455/249; 455/253; 330/279
[58] Field of Search ............... 455/333, 247, 249, 250, 455/253; 330/278, 279, 285

[56] References Cited

U.S. PATENT DOCUMENTS

| | | | |
|---|---|---|---|
| 2,115,676 | 4/1938 | Wheeler | 455/247 |
| 2,939,000 | 5/1960 | Krugman | 455/333 |
| 2,981,835 | 4/1961 | Webster et al. | 330/278 |

Primary Examiner—Marc E. Bookbinder
Attorney, Agent, or Firm—Thomas A. Briody; William J. Streeter; Marianne Rich

[57] ABSTRACT

A tuner with a radio-frequency pre-stage (1) and a mixer stage (2), provided with an oscillator signal. The mixer is formed by a transistor (12) incorporating an emitter resistor (13) in its emitter circuit. The radio-frequency signal is taken from the output of the radio-frequency pre-stage to the input of the mixer stage via a DC-biased diode (28). The DC path for the diode includes the emitter resistor of the mixer stage. The transistor and diode currents flowing through that path having the same direction of flow. The bias voltage of the diode is altered as a function of the amplitude of the unlimited intermediate-frequency signal via a control circuit (30), the direct current through the diode decreasing with increasing amplitude of the intermediate frequency signal.

5 Claims, 3 Drawing Figures

TUNER

BACKGROUND OF THE INVENTION

The invention relates to a tuner with a radio-frequency pre-stage whose output is connected to an input of a mixer stage. An oscillator signal from an oscillator is additionally fed to the mixer. The mixer is formed by a transistor which incorporates an emitter resistor in its emitter circuit and a collector circuit from which the intermediate-frequency signal is taken. Tuners of this kind are familiar from commercially available radio sets, particularly those equipped for reception in the FM band. A requirement which such tuners have to meet is that they must also be capable of handling without distortion fairly large input signals which result from, for example, cross-modulation or mixing products of harmonics. It has been proposed to connect in the path of the radio-frequency signal a variable voltage divider, consisting of diodes whose impedance is altered by a control circuit in the manner indicated in, for example, DE-OS No. 28 09 489. Tuners are, however, already known the gain of whose active switching elements is controlled, their operating point being altered for this purpose by a control circuit. The control takes the form, for example, of an upward adjustment of the operating-point current, thus lowering the gain, as indicated in DE-PS No. 11 76 718.

SUMMARY OF INVENTION

The object of the invention is to provide a tuner of the kind mentioned in the preamble, operating in the simplest possible manner from the switching technology point of view, such that it can also handle relatively large input signals without distortion or failure, i.e. exhibits good large-signal behavior. According to the invention, the radio-frequency signal is applied to the input of the mixer stage via a DC-biased diode. The DC path for the diode is through the emitter resistor of the mixer stage, the transistor and diode currents flowing via the emitter resistor of the mixer stage having the same direction of flow. A control circuit for the bias of the diode is provided which alters the bias voltage as a function of the amplitude of the unlimited intermediate-frequency signal, adjusting it to lower direct currents for increasing amplitude of the unlimited intermediate signal. This ensures that the signal to be handled in the tuner is influenced simultaneously in two ways, namely, by the fact that the diode acts as a variable voltage divider for the radio-frequency signal and by the fact that the operating point of the transistor in the mixer stage is adjusted upwards as a function of the direct current flowing through the diode, so that its gain and conversion transconductance are also altered. The upward adjustment, resulting from increasing amplitude of the unlimited intermediate-frequency signal, alters the operating point of the mixer-stage transistor to give higher currents, and promotes distortion-free handling of signals with fairly large amplitudes.

In a tuner in which the radio-frequency signal is coupled from the output of the radio-frequency preamplifier by a capacitor to the emitter of the mixer-stage transistor, the capacitor, together with the output impedance of the radio-frequency preamplifier, which impedance leads on an AC basis to the reference voltage level, forms what is basically a short-circuit for the intermediate-frequency signal. It has proved particularly advantageous to have the diode inserted immediately between the capacitor and the emitter of the mixer-stage transistor. This is a further means for ensuring that with increasing amplitude of the unlimited intermediate-frequency signal the increasing impedance of the diode disconnects the capacitor from the emitter resistance on an AC basis. The result is that a negative feedback of the intermediate-frequency signal occurs through the emitter resistance in the mixer stage, which is no longer AC-bridged for the intermediate-frequency signal, and hence also a reduction of its gain.

It has proved advantageous in a tuner in which the output of the radio-frequency pre-stage is formed by a parallel resonance circuit, for the control circuit for the bias voltage of the diode to be connected on an AC basis to the parallel resonance circuit of the radio-frequency pre-stage. The impedance of the control circuit damping the parallel resonance circuit increases with increasing amplitude of the unlimited intermediate-frequency signal. This damping of the parallel resonant circuit of the radio-frequency pre-stage causes a further reduction of the radio-frequency signal applied to the input of the mixer stage without additional switching elements being necessary for that purpose.

It has likewise proved advantageous for the control circuit for the bias voltage of the diode to be DC-coupled to a resistor determining the operating point of the radio-frequency pre-stage. The operating point of the radio-frequency pre-stage is shifted in the direction of decreased gain with increasing amplitude of the unlimited intermediate-frequency signal. The radio-frequency signal is thus also involved in the gain-control. In this process the alteration of the operating point of the radio-frequency pre-stage can, depending on the type of control desired, i.e. a downward or an upward control, lead to either lower or higher currents, although the latter type of control can again be regarded as more suitable with regard to large-signal behaviour.

It has also proved very advantageous for the control circuit for the bias voltage of the diode to be DC-coupled to the base circuit of the transistor of the mixer stage, the operating point of the mixer stage being shifted to higher currents with increasing amplitude of the unlimited intermediate-frequency signal. The alteration of the operating point of the mixer stage thus depends not only on the current flowing through the diode and the emitter resistance of the mixer stage, but also on the current applied to the base circuit of the transistor, which results in greater changes of the operating point of the mixer stage.

The invention will now be further explained with reference to drawings in which some examples of embodiment of the invention are illustrated, which examples must not be considered exhaustive.

DESCRIPTION OF THE PREFERRED EMBODIMENT

Figure 1:
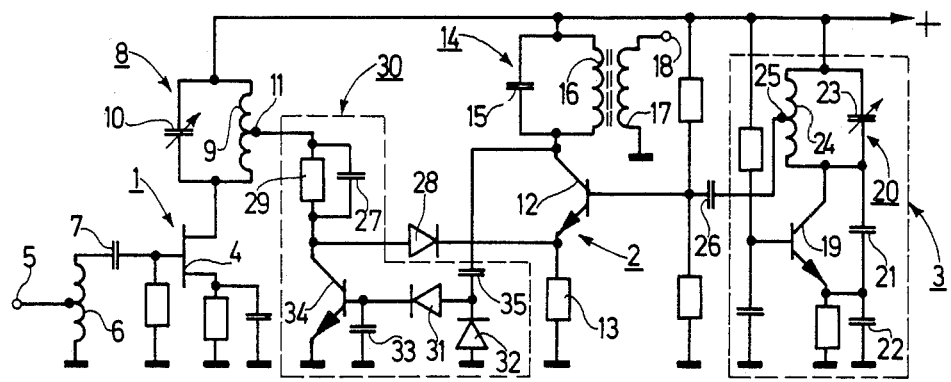
FIG. 1 shows the circuit diagram of a tuner in which the radio-frequency signal is applied to the emitter and the oscillator signal to the base of the transistor in the mixer stage.

In the tuner shown in FIG. 1 the radio-frequency preamplifier is marked 1, the mixer stage 2 and the oscillator 3. The radio-frequency preamplifier 1 is made up of a field effect transistor 4, to whose gate electrode the radio-frequency signal is led from an aerial input 5 through a matching transformer 6 and an isolating capacitor 7. As its output the radio-frequency preamplifier 1 has a parallel resonant circuit 8 consisting of an inductor formed by a coil 9 and a variable capacitor 10. The radio-frequency signal amplifier by the radio-frequency pre-stage is taken from a tap 11 on coil 9. It would also, of course, be basically possible to design the radio-frequency pre-stage in the familiar fashion as an aperiodic amplification stage. Mixer stage 2 incorporates a transistor 12 in whose emitter circuit an emitter resistor 13 and in whose collector circuit a parallel resonant circuit 14 tuned to the intermediate frequency are included. This parallel resonsant circuit 14 consists of a capacitor 15 and coil 16 to which, for example, a secondary winding 17 is connected which forms the output 18 for the intermediate-frequency signal. Considering the known state of the art, a number of possibilities are available for the structure of oscillator 3. In the present case a transistor 19 operating in a grounded-base connection is provided which has a parallel resonant circuit 20 in its collector circuit, from which a negative feedback to the emitter of this transistor is formed through a capacitive voltage divider 21, 22. The parallel resonant circuit 20 has a variable capacitor 23 and an inductor formed by a coil 24, which has a tap 25 from which the oscillator signal is applied via a capacitor 26 to the base of the transistor 12 constituting the mixer stage 2.

In the present example of an embodiment of the circuit the radio-frequency signal taken from the parallel resonant circuit 8 of the radio-frequency preamplifier 1 is applied to the emitter of transistor 12 in the mixer stage 2. This is done in such a way that a capacitor 27 is connected to tap 11 of coil 9 and also, in series, to a diode 28 which in turn is directly connected to the emitter of transistor 12. To form a DC path for diode 28 a resistor 29 is also provided which is here connected in parallel to capacitor 27 so that this DC path from the supply voltage includes coil 9, resistor 29, diode 28 and the emitter resistor 13 of mixer stage 2 to the reference voltage level. The polarity of diode 28 is chosen such that it is operated in the forward direction and its current flowing through the emitter resistor 13 of mixer stage 2 has the same direction of flow as the current flowing from transistor 12 through the emitter resistor 13. The fact that diode 28 is operated in the forward direction means that it has a low impedance, so that the radio-frequency signal can be taken practically unimpeded from parallel circuit 8 through capacitor 27 and diode 28 to the emitter of transistor 12, which forms the input of the mixer stage for the radio-frequency signal.

The capacitance of capacitor 27 is suitably chosen so that it can, together with the impedance of parallel resonant circuit 8, which impedance leads on an AC basis from tap 11 on coil 9 to the reference voltage level, form what is basically a short-circuit for the intermediate-frequency signal. The switching elements can at the same time be harmonised with each other in such a way that they immediately form an absorption circuit for the intermediate-frequency signal. This ensures that with diode 28 in the forward direction the emitter resistor 13 of mixer stage 2 is bridged on an AC basis for the intermediate-frequency signal with the result that mixer stage 2 operates with higher gain for the intermediate-frequency signal since no negative feedback is effected by the emitter resistor 13.

In order to be able to influence diode 28 with regard to its mode of operation, a control circuit 30, constructed in the usual way, is provided. This control circuit 30 consists of a rectifier circuit, formed by two diodes 31 and 32, which is connected to a smoothing capacitor 33 to which, in turn, the base-emitter of a transistor amplifying the control signal is connected. The collector of the transistor is connected to the junction point of resistor 29 and diode 28, so that resistor 29 also acts as a load resistance for transistor 34. The unlimited intermediate-frequency signal is applied as an input signal to this control circuit 30, which results in the present case from the fact that the rectifier arrangement of the control circuit is coupled to the collector of transistor 12 through a capacitor 35. The intermediate-frequency signal applied to the control circuit could, of course, also be taken from an intermediate-frequency amplification stage following mixer stage 2 provided the intermediate-frequency signal is still not subjected to any limitation in this stage. A suitable bias voltage could likewise be applied to the rectifier in order either to delay or speed up the application of control, depending on what is wanted. For example, to speed up the start of control, the rectifier of the control circuit could be DC-coupled to the emitter resistor 13 of transistor 12.

The method of operation of this circuit is as follows. With a suitably small radio-frequency signal and also a correspondingly small intermediate-frequency signal, control circuit 30 does not operate, its transistor 34 is not conducting and, consequently, diode 28 is DC-biased in the forward direction and presents little resistance. The radio-frequency signal is applied practically unattenuated to mixer stage 2. Transistor 12 of mixer stage 2 is at this moment at an operating point which ensures optimum conversion transductance and high amplification for the intermediate-frequency signal, while, owing to the AC decoupling of the emitter 13 associated with capacitor 27, there is no negative feedback for the intermediate frequency signal. As the amplitude of the radio-frequency signal increases, the amplitude of the intermediate-frequency signal also increases. This results in rectification of the intermediate-frequency signal occurs in control circuit 30, which has the further consequence that transistor 34 becomes increasingly conductive, so that its collector current flowing via resistor 29 increases. This means that the voltage drop at resistor 29 becomes greater and the direct current through diode 28 becomes smaller. A smaller current through diode 28, however, means that its impedance rises, with the consequence that diode 28, together with the input impedance of mixer stage 2, becomes increasingly effective as a voltage divider for the radio-frequency signal, so that correspondingly less of the radio-frequency signal is applied to mixer stage 2. Owing to the fact that it also flows through the emitter resistor 13 of mixer stage 2, a decreasing direct current through diode 28 has the further consequence that the voltage drop at resistor 13 becomes smaller. This means that the current through transistor 12 increases so that the latter is shifted by upward adjustment to operating points which have a smaller conversion transductance, and also that less intermediate-frequency signal is generated. As the current through transistor 12 increases, its gain factor decreases so that this too produces a reduction of the intermediate-frequency signal. The fact that the impedance of diode 28 increases, however, gives rise to a further effect, namely that the DC-decoupling of the emitter resistor 13 for the intermediate-frequency signal becomes progressively smaller because the impedance of diode 28 lies between the emitter resistor 13 plus the capacitor 27 and the impedance of the parallel resonant circuit 8 which leads on an AC-basis to the reference voltage level. This means that the emitter resistor 13 increasingly forms a negative feedback for the intermediate-frequency signal and hence the gain of the intermediate-frequency signal in the mixer stage 2 is reduced.

As can be seen, there immediately occur three effects which produce a signal attenuation with increasing radio-frequency signal. These effects include a voltage division by diode 28, an upward adjustment of the operating point of transistor 12 of the mixer stage and an increasing negative feedback of the intermediate-frequency signal. The upward adjustment of the mixer stage additionally ensures that it is shifted to operating points at which larger signals can be more readily processed without distortion, namely for decreasing conversion gain and decreasing amplification. Very good large-signal behaviour of the tuner is thus ensured.

According to the present circuit, however, a further effect also occurs which improves the large-signal behaviour of the tuner owing to the fact that the control circuit 30 is also AC-coupled to the parallel resonant circuit 8 of the radio-frequency preamplifier. The more transistor 34 becomes conducting, the smaller its impedance in the collector-emitter region becomes. Since, however, this impedance is directly connected to tap 11 of coil 9 on an AC basis through capacitor 27, it also damps the parallel resonant circuit 8, with the consequence that the gain of the radio-frequency signal in the radio-frequency preamplifier and the resonant rise in the parallel resonant circuit for the radio-frequency signal decrease. With such damping, therefore, a further improvement of the large-signal behaviour of the tuner is achieved. In this process the degree of damping of the parallel resonant circuit 8 depends in a known fashion on how tap 11 is chosen in relation to coil 9. If desired, the radio-frequency signal could also be taken directly from parallel resonant circuit 8 as a whole, in which case control circuit 30 would be directly AC-coupled to parallel resonant circuit 8. If, however, a damping of the parallel resonant circuit is not desirable, e.g. for reasons of selectivity, the control circuit can be AC-decoupled from the parallel resonant circuit by inserting a choke in series in the collector of transistor 34.

Figure 2:
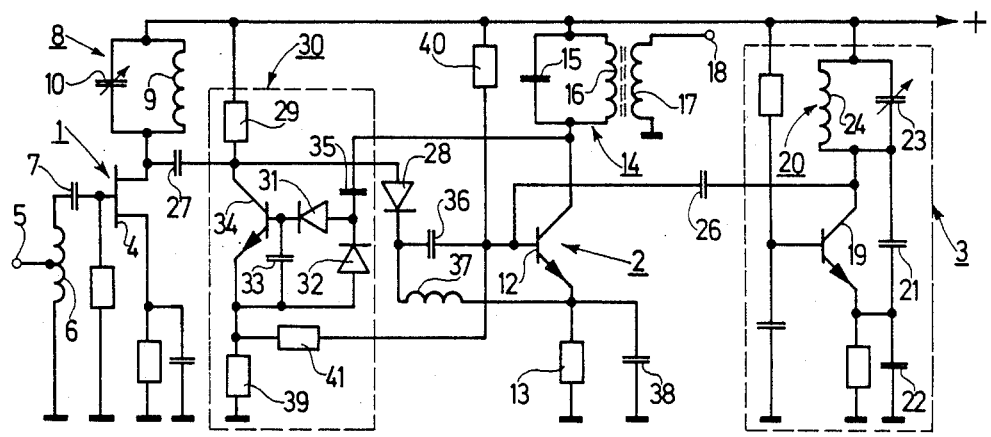
FIG. 2 shows the circuit diagram of a tuner in which both the oscillator signal and the radio-frequency signal and also an additional control signal is applied to the base of the transistor in the mixer stage.

The example of the embodiment given in FIG. 2 shows the use of the invention when a mode of operation different from that in the example of the embodiment given in FIG. 1 is chosen for mixer stage 2. Here, both the oscillator signal and the radio-frequency signal are applied to the base of transistor 12 in mixer stage 2. These signals are taken through a high impedance directly from parallel resonant circuits 8 and 20, respectively, through capacitors 27 and 26, respectively. Diode 28 is again connected in series to capacitor 27, and, in this case, AC-coupled to the base of transistor 12 through a capacitor 36. To ensure again in the present case that the direct current flowing through diode 28 also flows through the emitter resistor 13 of mixer stage 2, diode 28 is also DC-coupled to the emitter of transistor 12 through a coil 37. The insertion of such a coil 37 has the consequence that capacitor 27, together with the impedance of parallel resonant circuit 8, which leads on an AC basis to the reference voltage level, can no longer be used to form a short-circuit for the intermediate-frequency signal. To ensure, however, that the base-emitter circuit of transistor 12 is terminated with a low impedance for the intermediate-frequency signal, as is clearly necessary for proper operation of the mixer stage, the capacitance of capacitor 36 and the inductance of coil 37 are chosen so that they together form an absorption circuit for the intermediate-frequency signal. The emitter resistor 13 of transistor 12 is additionally bridged on an AC basis for the intermediate-frequency signal by parallel connection of a capacitor 38.

The control circuit 30 for controlling the mode of operation of diode 28 is constructed similarly to that shown in the example of the embodiment in FIG. 1. In this example of embodiment, however, an additional measure has been taken. The control circuit 30 is also AC-coupled to the base circuit of transistor 12, so that the operating point of mixer stage 2 is shifted to higher currents for increasing amplitude of the unlimited intermediate-frequency signal. To achieve this effect a resistor 39 leading to the reference voltage level is inserted in series to the emitter of transistor 34 and the voltage divider formed by the resistors 40 and 41 is connected to the junction of the emitter of transistor 34 and resistor 39 in order to bias the base of transistor 12 with resistor 41. This ensures that in the course of adjustment when the current through transistor 34 increases, the voltage drop at resistor 39 increases, with the result that the bias acting at the base of transistor 12 shifts the operating point of transistor 12 in the direction of higher currents. It is clear that in this process the upward adjustment from the base of transistor 12 is effected in a fashion corresponding to the upward adjustment of transisor 12 caused by the direct current flowing through diode 28, coil 7 and emitter resistor 13, since the direct current flowing through diode 28 becomes smaller again with increasing current through transistor 34, which causes a reduction of the voltage drop at emitter resistor 13. Transistor 12 is consequently influenced both from its emitter side and from its base side in the sense of an upward adjustment, so that, seen as a whole, a larger control range is obtained for mixer stage 2.

The manner of operation of diode 28 as a voltage divider in combination with the input impedance of mixer stage 2 is again similar to that occurring in the example of the embodiment in FIG. 1. In the present example of an embodiment, however, no negative feedback for the intermediate-frequency signal occurs in mixer stage 2 with increasing impedance of diode 28 because here the emitter resistor 13 of the mixer stage is constantly AC-decoupled for the intermediate-frequency signal. As in the example of the embodiment in FIG. 1, however, the control circuit 30 is again AC-coupled to the parallel resonant circuit 8 of the radio-frequency pre-stage 1, so that here, too, damping of this parallel resonant circuit occurs with increasing adjustment.

In the example in FIG. 2 three measures effect a signal attenuation with increasing radio-frequency signal, namely the voltage division by diode 28, the upward adjustment of the operating point of transistor 12 in mixer stage 2 and the damping of the parallel resonant circuit 8 of the radio-frequency pre-stage 1 by control circuit 30. In this manner good large-signal behaviour of the tuner is again achieved.

Figure 3:
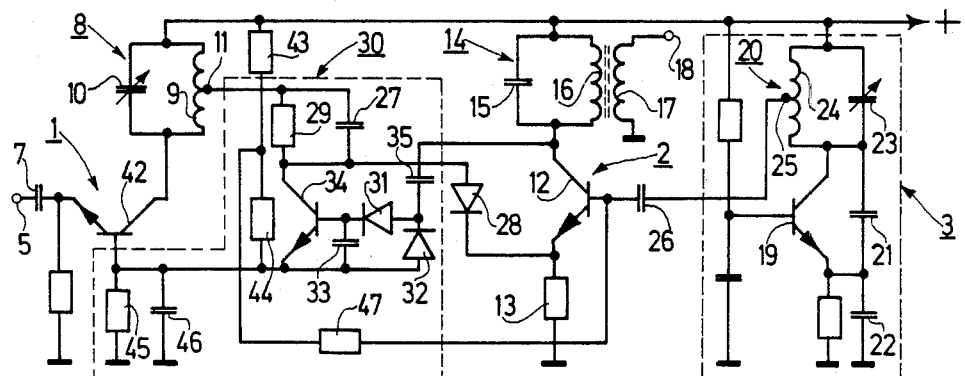
FIG. 3 shows the circuit diagram of a tuner in which, additionally, the radio-requency pre-stage is controlled.

In the example of the embodiment in FIG. 3 a method of operation of mixer stage 2 is provided as in the example of embodiment in FIG. 1, in which the radio-frequency signal is applied to the emitter of transistor 12 through diode 28 and the oscillator signal to the base of transistor 12 through a capacitor 26. The control circuit 30 provided for influencing the method of operation of diode 28 is constructed in similar fashion to the example of the embodiment in FIG. 1. The example of embodiment in FIG. 3, however, additionally incorporates another adjustment for the radio-frequency pre-stage 1 and also, as in the example of the embodiment in FIG. 2, an additional adjustment of transistor 12 of mixer stage 2 from its base.

In the example of the embodiment now being considered the radio-frequency pre-stage 1 is formed by a transistor 42 in a grounded-base connection, to whose emitter the radio-frequency signal is led from aerial input 5 through a capacitor 7. The parallel resonant circuit 8 is incorporated in the collector circuit of transistor 42. The setting of the operating point of transistor 42 is effected at its base by a voltage divider formed by resistors 43, 44 and 45, its base being connected to the junction of resistors 44 and 45. For AC-decoupling resistor 45 is bridged with a capacitor 46. In order now to effect adjustment of the radio-frequency pre-stage, control circuit 30 is DC-coupled to a resistor determining the operating point of the radio-frequency pre-stage, to which end in the present case the emitter of transistor 34 is connected to the junction of resistors 44 and 45. When adjustment is initiated, the current through transistor 34 again increases, with the result that the voltage drop at resistor 45 increases, so that the operating point of transistor 42 in the radio-frequency pre-stage is shifted to higher currents. In this way an upward adjustment of the radio-frequency pre-stage is achieved, which results in a reduction of its gain. If desired, a downward adjustment of the radio-frequency pre-stage 1 could, of course be provided, a possible method being to have the emitter of transistor 34 DC-coupled to the emitter resistor of transistor 12.

The operating-point setting of transistor 12 in mixer stage 2 is also derived from voltage divider 43, 44 and 45 by connecting its base to the junction of resistors 43 and 44 via a resistor 47. Thus, the voltage drop occurring at resistor 45 when adjustment is initiated by the increasing current through transistor 34 determines the extent to which the bias of the base of transistor 12 in mixer stage 2 is influenced, its operating-point current being increased in the sense of an upward adjustment. This adjustment at the base side of transistor 12 is again effected in a manner corresponding to control at the emitter side, which is effected by the direct current flowing via diode 28 and emitter resistor 13, so that, seen as a whole, a larger control range for mixer stage 2 is again obtained.

Otherwise, the way in which this circuit operates is similar to that of the example of embodiment according to FIG. 1. Here, however, the signal attenuation with increasing radio-frequency signal depends on five factors, namely the voltage division by diode 28, the upward adjustment of transistor 12 in mixer stage 2, the increasing negative feedback of the intermediate-frequency signal by the emitter resistor 13 of mixer stage 2, the damping of the parallel resonant circuit of radio-frequency stage 1 by control circuit 30 and, finally, the upward adjustment of transistor 42 in radio-frequency pre-stage 1. In this way very good large-signal behaviour of the tuner is again obtained.

As can be seen from the above, a series of variations on the examples of the embodiment described are possible without exceeding the limits of the invention. This applies particularly to the arrangement and mode of operation of the individual stages of the tuner and also to the manner in which they are adjusted. It may be stated by way of example that the extraction of the radio-frequency signal from the parallel resonant circuit need not necessarily be effected capacitively but can also be done inductively if coil 9 of the parallel resonance circuit is provided with a secondary winding. Additionally, diode 28 can, if desired, take the form of the base-emitter diode of a transistor connected in a cathode-coupled push-pull stage (long-tail pair) configuration with, for example, transistor 12 of mixer stage 2.

What is claimed is:

1. A tuner for furnishing an intermediate frequency signal in response to a received radio frequency signal, comprising:

preamplifier circuit means for receiving said radio frequency signal;

means for furnishing a local oscillator signal;

mixing means connected to said preamplifier means and said local oscillator furnishing means and comprising a transistor having a base circuit connected to receive said local oscillator signal, a collector circuit for furnishing said intermediate frequency signal, and an emitter circuit having an emitter resistor and carrying emitter current, said mixing means having a gain varying inversely with direct current through said emitter resistor;

a diode connected between said preamplifier circuit and said mixing means for conducting said radio frequency signal from said preamplifier circuit means to said mixing means, said diode having an impedance varying as a function of a bias voltage applied thereto;

means connecting said diode to said emitter resistor so that current flowing through said diode flows through said emitter resistor in the same direction as said emitter current; and control circuit means connected to said diode and said mixing means for receiving said intermediate frequency signal and furnishing a bias voltage increasing said impedance of said diode in response to increases in said intermediate frequency signal, whereby increases in said intermediate frequency signal increase said impedance of said diode thus decreasing said radio frequency signal applied to said mixer stage and changing said current through said emitter resistor in a direction decreasing said gain of said mixing means.

2. A tuner as claimed in claim 1, wherein said preamplifier circuit means has a radio frequency output impedance;

further comprising a capacitor connected to said preamplifier circuit means and in series with said diode, said capacitor and said output impedance together shortcircuiting said intermediate frequency signal to a reference voltage.

3. A tuner as claimed in claim 1, wherein said preamplifier circuit means comprises a parallel resonant circuit;

wherein said control circuit means is connected to said parallel resonant circuit of said preamplifier circuit means, said control circuit having a control impedance for increasingly damping said parallel resonant circuit with increases in said intermediate frequency signal.

4. A tuner as claimed in claim 1, wherein said preamplifier circuit means comprises a resistor fixing the gain thereof;

further comprising means for dc coupling said control circuit means to said resistor of said preamplifier circuit means so that said gain of said preamplifier circuit means is reduced with increases in said intermediate frequency signal.

5. A tuner as claimed in claim 1, further comprising means for dc coupling said control circuit means to said transistor of said mixing means, so that said gain of said mixing means is reduced for increasing amplitudes of said intermediate frequency signal.

* * * * *